United States Patent [19]

Doering et al.

[11] Patent Number: 4,561,170
[45] Date of Patent: Dec. 31, 1985

[54] METHOD OF MAKING FIELD-PLATE ISOLATED CMOS DEVICES

[75] Inventors: Robert R. Doering, Plano; Gregory J. Armstrong, Houston, both of Tex.

[73] Assignee: Texas Instruments Incorporated, Dallas, Tex.

[21] Appl. No.: 626,572

[22] Filed: Jul. 2, 1984

[51] Int. Cl.[4] .................. H01L 21/263; H01L 29/78; H01L 27/04
[52] U.S. Cl. .................................... 29/571; 29/576 B; 29/578; 148/1.5; 148/187; 148/DIG. 82; 357/91
[58] Field of Search ...................... 29/571, 576 B, 578; 148/1.5, 187; 357/91

[56] References Cited

U.S. PATENT DOCUMENTS

| | | | |
|---|---|---|---|
| 4,224,733 | 9/1980 | Spadea | 29/571 |
| 4,315,781 | 2/1982 | Henderson | 148/1.5 |
| 4,330,931 | 5/1982 | Liu | 29/571 |
| 4,397,077 | 8/1983 | Derbenwick et al. | 29/571 |
| 4,435,895 | 3/1984 | Parrillo et al. | 29/571 |
| 4,458,406 | 7/1984 | De La Moneda et al. | 29/571 |
| 4,459,740 | 7/1984 | Schwabe et al. | 29/576 B |
| 4,462,149 | 7/1984 | Schwabe | 29/571 |
| 4,464,824 | 8/1984 | Dickman et al. | 29/578 |
| 4,505,027 | 3/1985 | Schwabe et al. | 29/577 C |

*Primary Examiner*—Upendra Roy
*Attorney, Agent, or Firm*—John G. Graham

[57] ABSTRACT

A dynamic read/write memory or the like is made by a twin-well CMOS process that employs field-plate isolation rather than thick field oxide, with no separate channel stop implant. The field plate is grounded over P well areas, and connected to the positive supply over the N wells. One-transistor memory cells are of metal-gate construction with N+ drain regions buried beneath oxide, and other transistors are constructed with silicided, implanted, source/drain regions, self-aligned to the metal gates, employing sidewall oxide spacers to provide lightly-doped drains.

10 Claims, 11 Drawing Figures

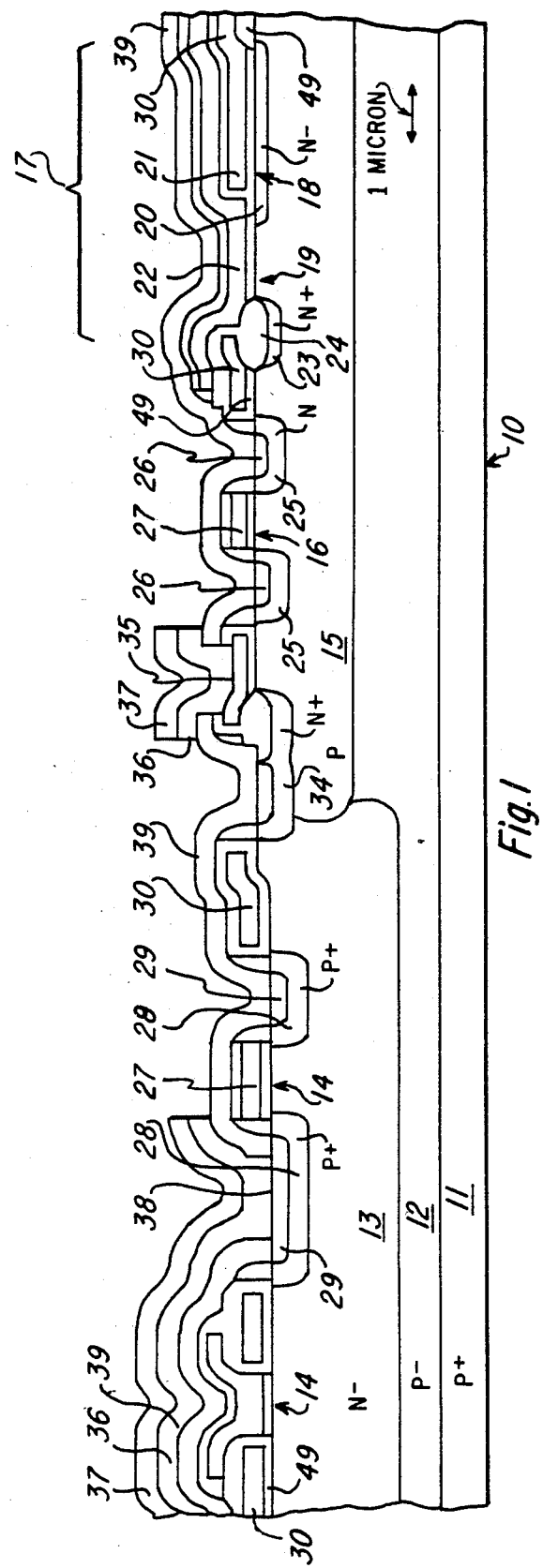

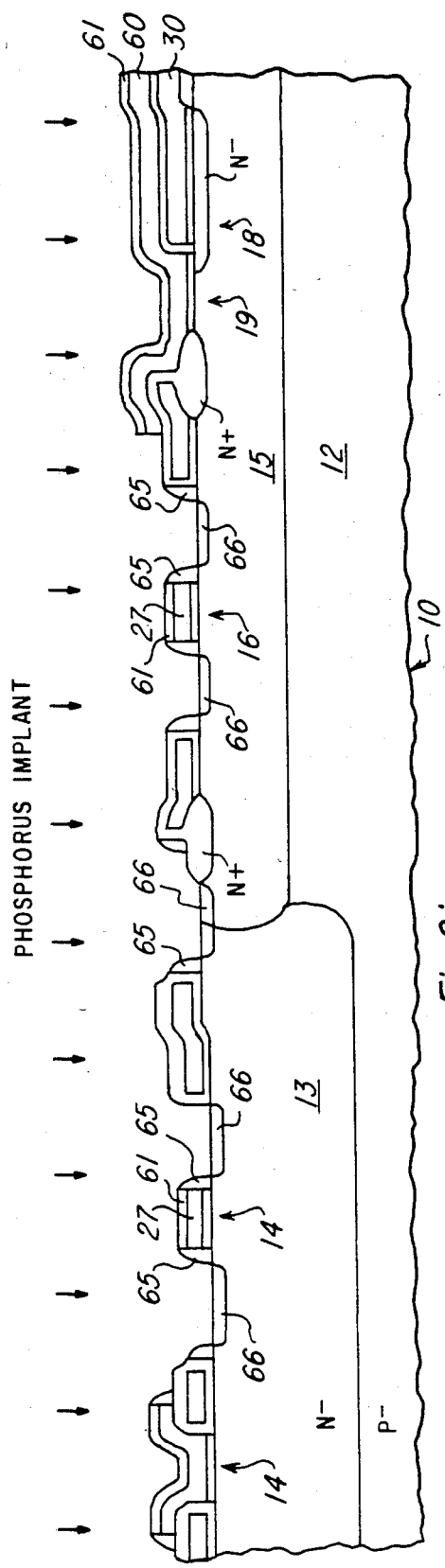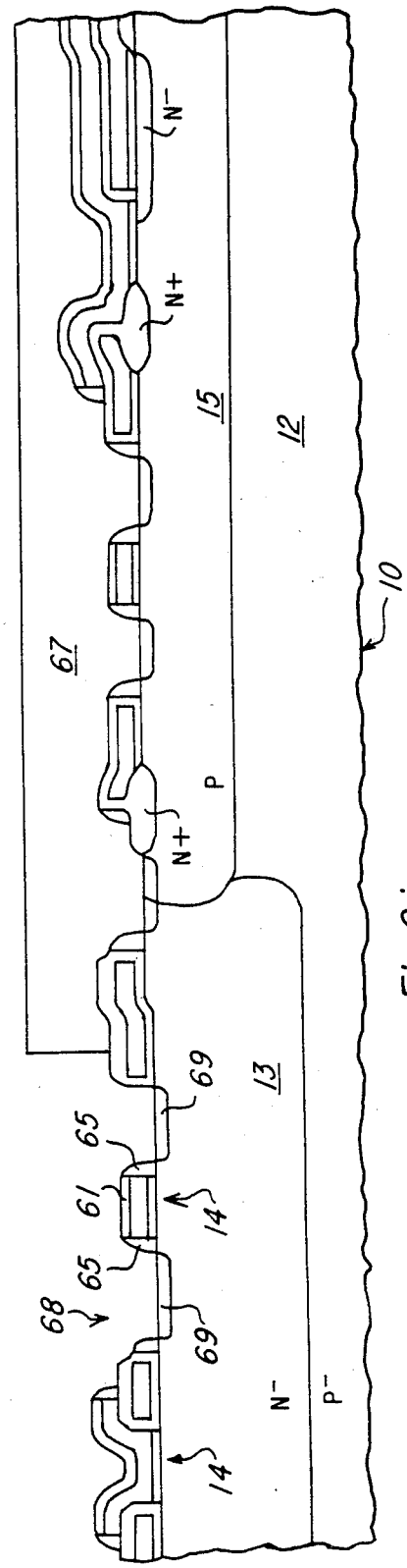

METHOD OF MAKING FIELD-PLATE ISOLATED CMOS DEVICES

BACKGROUND OF THE INVENTION

This invention relates to semiconductor devices, and more particularly to methods of making CMOS circuits of the type used in VLSI dynamic memory devices or the like.

Dynamic read/write memory devices of the type shown in U.S. Pat. No. 4,239,993, issued to McAlexander, White and Rao, assigned to Texas Instruments, have been manufactured by N-channel, self-aligned, silicon gate processes as disclosed in U.S. Pat. No. 4,055,444 or U.S. Pat. No. 4,240,092, for example. Requirements for low power have led to more widespread use of CMOS processing as in U.S. Pat. No. 4,295,897, for example, and further the higher densities in 256K-bit or 1-Megabit dynamic RAMs have necessitated the use of smaller device geometries, presenting problems of alignment, step coverage, undercutting, etc.

It is the principal object of this invention to provide improved methods of making integrated circuits for semiconductor memory devices or the like, particularly low-power, high-density devices. Another object is to provide improved CMOS processes as may be used for making high density dynamic RAMs.

SUMMARY OF THE INVENTION

In accordance with one embodiment of the invention, a dynamic read/write memory or the like is made by a twin-well CMOS process that employs field-plate isolation rather than thick field oxide, with no separate channel-stop implant. The field plate is grounded over P well areas, and connected to the positive supply over the N wells. One-transistor memory cells are of metal gate construction with N+ drain regions buried beneath oxide, and other transistors are constructed with silicided implanted source/drain regions, self-aligned to the metal gates employing sidewalls oxide spacers to provide lightly-doped drains.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a greatly enlarged elevation view in section of a very small portion of a semiconductor chip showing one cell of a dynamic memory cell array and various peripheral N-channel and P-channel transistors, made by the improved process according to the invention;

FIGS. 2a-2j are elevation views in section of the device of FIG. 1, at successive stages in the manufacturing process, taken along the same section as in FIG. 1.

DETAILED DESCRIPTION OF SPECIFIC EMBODIMENT

Figure 2A:
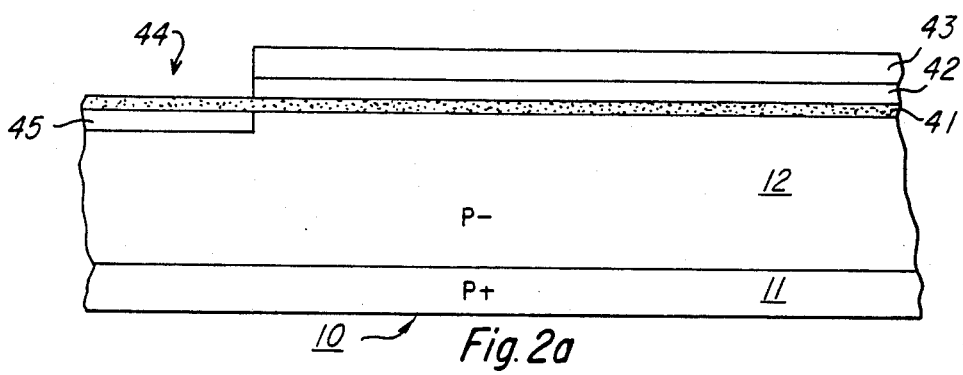

In FIG. 1, an example of an MOS VLSI integrated circuit device made according to the invention is illustrated. This is a twin-well CMOS device formed on a silicon chip or bar 10 having P+ substrate 11 and a P− epitaxial layer 12. An N well, or tank, 13 has field-effect transistors 14 formed therein, and a P well, or tank, 15 has an N-channel, self-aligned gate transistor 16, and a one-transistor, dynamic, read/write memory cell 17, formed therein. The memory cell includes a storage capacitor 18 and a metal-gate, N channel, access transistor 19. The capacitor 18 includes an N implant region 20 beneath a polysilicon plate 21; this polysilicon plate 21 is grounded and also functions as an isolating field plate. The access transistor 19 has a refractory-metal-gate in the form of a molybdenum layer 22, and the drain 23 of this transistor (also forming a bit line for the memory cells) is an N+ implant buried beneath oxide 24. The N− channel transistor 16, on the other hand, has shallower N+ source/drain regions 25 with silicided surface regions 26 formed therein, and has a molybdenum gate 27. The regions 25 are self-aligned with the gate 27. The P channel transistors 14 likewise have shallow P+ source/drain regions 28 with silicided surface regions 29. One of these P channel transistors 14 of FIG. 1 is seen in section perpendicular to its source-drain path (on left) and the other is in section parallel to the source-drain path.

An important feature of the invention is the field plate 30 which covers all of the face of the chip except for (a) silicided N+ and P+ source/drain areas 25 and 28 and interconnects using these regions, (b) transistor channels, (c) contacts from metal to silicon, and (d) a gap 31 surrounding each N well. The field plate is grounded in all P well areas, and connected to Vdd in all N well areas. This field plate 30 is insulated from the silicon surface by a thermal silicon dioxide layer 49 which is about 1500 Å in thickness, contrasted with the usual field oxide which was about 10,000 Å thick. This is an important difference because the problems of moat encroachment in growing thick oxide, and channel stop encroachment, as well as step coverage, are avoided with the thinner isolation structure. The N and P wells beneath the field plate 30 have surface concentrations sufficient to avoid conductive paths beneath the field plate at the zero-voltage bias of the P well field plate, of Vdd for the N well areas. Wherever interconnects pass over field areas, the field plate 30 is interposed, so no parisitic transistors can be created. Even though the threshold voltage of the silicon surface beneath the P well field plate is perhaps only one or two volts, the grounded field plate prevents conduction.

A silicided N+ implanted region 34 formed at the same time as the source/drain regions 25 extends across the interface between the N well 13 and P well 15. A metal-to poly contact 35 is made to the field plate 30 to connect it to ground. This metal contact and like contacts with associated interconnects are made of a layer 36 of refractory metal, tungsten in this example, covered by a layer 37 of aluminum. Another example contact 38 is shown to a P+ region 28 in the N well. A multilevel insulator layer 39 separates the metal interconnects from the underlying moly gates 27 and the like.

Referring to FIG. 2a, the first step in the process of making the structure of FIG. 1 is creating the N well 13. This is done by growing a thin coating 41 of silicon oxide on a silicon slice which includes the bar 10. This slice would be perhaps 4 inches in diameter, whereas the width of the bar 10 seen in FIG. 1 is only about twenty microns. The silicon oxide 41 is thermally grown by exposing the slice to steam for about ten minutes at 900° C., producing a thickness of about 300 Å. A silicon nitride layer 42 is deposited over the entire surface of the slice by a low-pressure chemical-vapor deposition step to a thickness of about 1000 Å. A coating of photoresist 43 is spun onto the silicon slice, then exposed to light through a mask which defines the shape of the N tank 13, then developed to remove the photoresist above the tank, leaving an opening 44. The silicon nitride 42 is etched away, using a dry-etch process, stopping at the oxide 41. A phosphorus implant is performed at a dosage of about $5 \times 10\exp 12$ per sq cm at an energy of 150 KeV, creating N regions 45 which will ultimately form the tank 13 after heat treatment diffuses the phosphorus into the silicon.

Figure 2B:
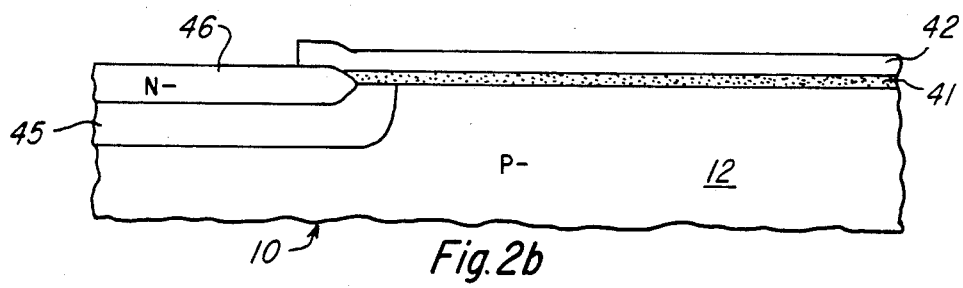

Turning to FIG. 2b, the photoresist 43 is stripped off, and a layer of thermal silicon oxide 46 is grown over the region 45, using the silicon nitride 42 as an oxidation mask. This oxide 46 is grown in steam at 900° C. for about $2\frac{1}{2}$ hours to produce a thickness of about 3000 Å. The N implanted region 45 is driven deeper into the silicon by this high temperature operation, but not to its ultimate depth.

Figure 2C:
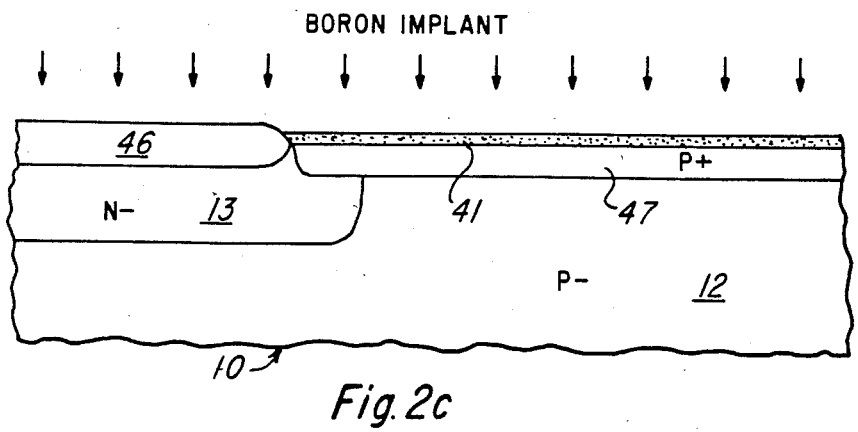

As seen in FIG. 2c, the nitride 42 is stripped off by an etchant such as phosphoric acid, and the slice is exposed to a temperature of about 1100° C. for about ten hours in an inert atmosphere such as argon to complete the drive-in of the region 45 to create the N tank 13. Next the slice is subjected to a boron implant as the first step in creating the P tank 15. This implant is at a dosage of about $5 \times 10\exp 12$ per sq cm at 50 KeV, and creates a shallow P region 47 beneath the oxide 41, but is masked by the thick oxide 46.

Figure 2D:
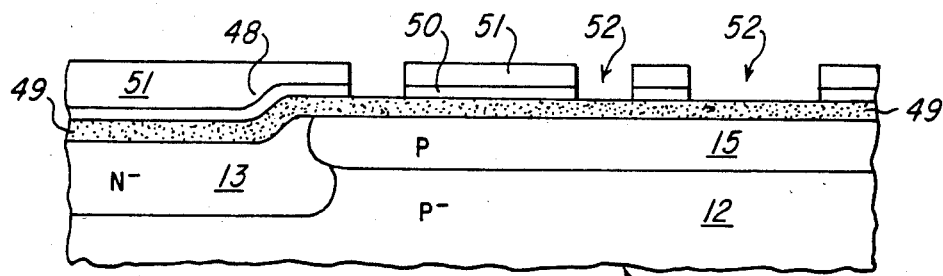

Referring to FIG. 2d, the boron implanted in shallow region 47 is subjected to a drive-in step at about 1100° C. for about 3 hours in an argon atmosphere, producing the P tank 15. All of the oxide 41 andd 46 is then removed by an etchant, leaving a discontinuity 48 at the juncture which is used for alignment of subsequent masks. A this oxide layer 49 of about 1500 Å is grown in steam at 900° C. Parts of this oxide layer 49 remain in the finished device and function as isolation between the field plate 30 and the underlying silicon. A layer 50 of silicon nitride is deposited to a thickness of about 750 Å to function as an oxidation mask when growing the thick oxide 24. A coating of photoresist 51 is applied to the surface of the slice for patterning the nitride 50, and exposed to uV light through a mask which will define the transistors and capacitors of the dynamic RAM cells 17, aligning to the discontinuity 48. Upon developing, holes 52 in the photoresist 51 define a pattern for then removing the silicon nitride 50 by a dry etch. Some of the oxide 49 in the holes 52 is removed by this etch, but at least 1000 Å will remain.

Figure 2E:
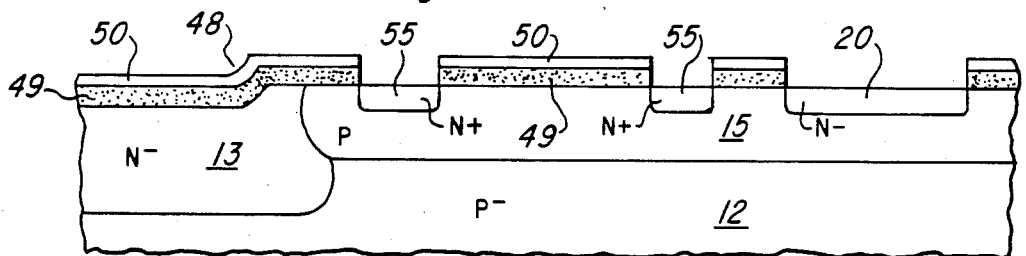

Referring to FIG. 2e, the next step is stripping off the photoresist 51 and applying a new coating of photoresist which is patterned using a mask (aligned to discontinuity 48) to uncover holes over what will become the bit lines 23 but leaving capacitor 18 covered. Then, using this photoresist to mask the areas where the capacitors 18 will be, and also the nitride 50 to mask within where holes are opened, the slice is subjected to an etchant to remove the oxide 49 in areas 54. Next, the resist 53 is stripped off, and an arsenic implant is performed at a dosage of $1 \times 10\exp 16$ per sq cm at 50 KeV to create N+ regions 55 which will be the buried N+ regions 23 for the bit lines and guard ring 33. The oxide 49 masks this implant in the area of the capacitor 18. The slice is next subjected to a heat treatment to anneal the arsenic-implanted silicon in regions 55; this is done at 900° for $1\frac{1}{2}$ hours in argon. The implanted regions 55 penetrate deeper into the silicon after this anneal.

Figure 2F:
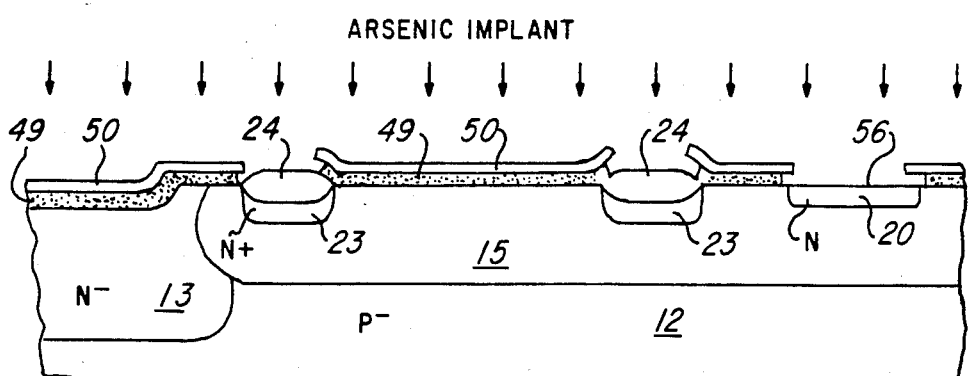

Turning now to FIG. 2f, the slice is next subjected to an oxide etchant to strip off the oxide 49 over the capacitor region. This is a wet etch so the oxide beneath the edges of the nitride 50 is undercut. Then, the slice is subjected to an oxidation at 900° C. for about 20 minutes, first in dry oxygen and then in steam for the last half, to grow the oxide 24 over the buried N+ regions 23, and to grow a dummy oxide coating over what will be the capacitor region. Due to the $N_o+$ doping, the oxide 24 grows to a thickness of 3000 Å but over the capacitor region the oxide 56 only grows to about 300 Å. The N storage regions 20 for the capacitors 18 are now created by an arsenic implant at a dosage of $1 \times 10\exp 14$ per sq cm at 150 KeV. This arsenic implant does not penetrate the nitride masking at any other part of the slice.

The dummy oxide 56 over the capacitor regions 20 is now stripped off by wet etch, which also removes a small amount of the oxide 24 over the buried N+ regions. The nitride 50 is then stripped off using hot phosphoric acid as an etchant. A thin oxide coating of about 100 Å is then grown over the capacitor region 20 to function as the capacitor dielectric. This is grown in oxygen and HCl at about 850° C.

Figure 2G:
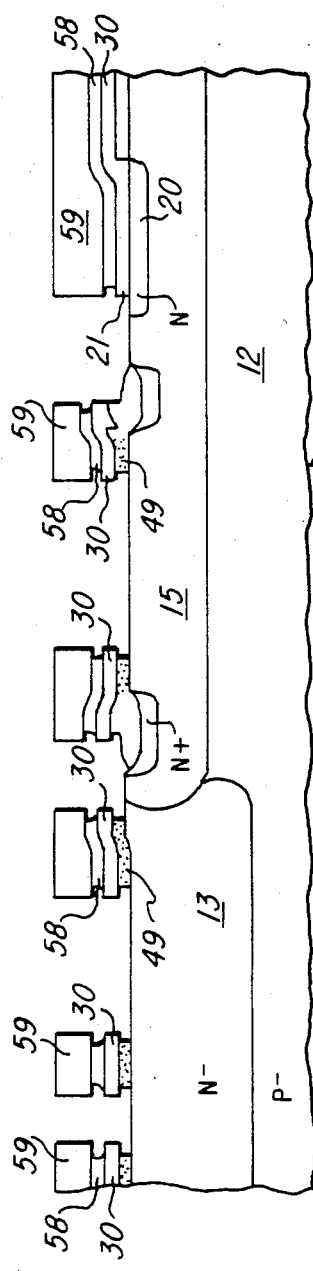

Referring to FIG. 2g, a layer of polycrystalline silicon is deposited over the entire slice to a thickness of about 3000 Å using a CVD process, creating what will be the field plate 30 and the capacitor plate 21. This poly layer is doped by exposing to an atmosphere of phosphorus oxychloride plus oxygen and nitrogen for ten minutes at about 950° C., and the glaze grown during this step is stripped off. Then, the polysilicon layer (still covering the entire slice) is oxidized to a thickness of 2000 Å by exposing to steam for about $\frac{1}{2}$ hour at about 900° C. to form a thermal oxide coating 58. A coating 59 of photoresist is applied, and exposed to light through a mask which defines the storage plates 21 and field plates 30, then an etch sequence is performed to remove the oxide 58 (with wet etch), the polysilicon 57 (with dry etch) and the oxide 49 (with wet etch). The photoresist 59 is then stripped away. This exposes silicon in all of the areas where the transistors and the guard ring are to be formed.

Figure 2H:
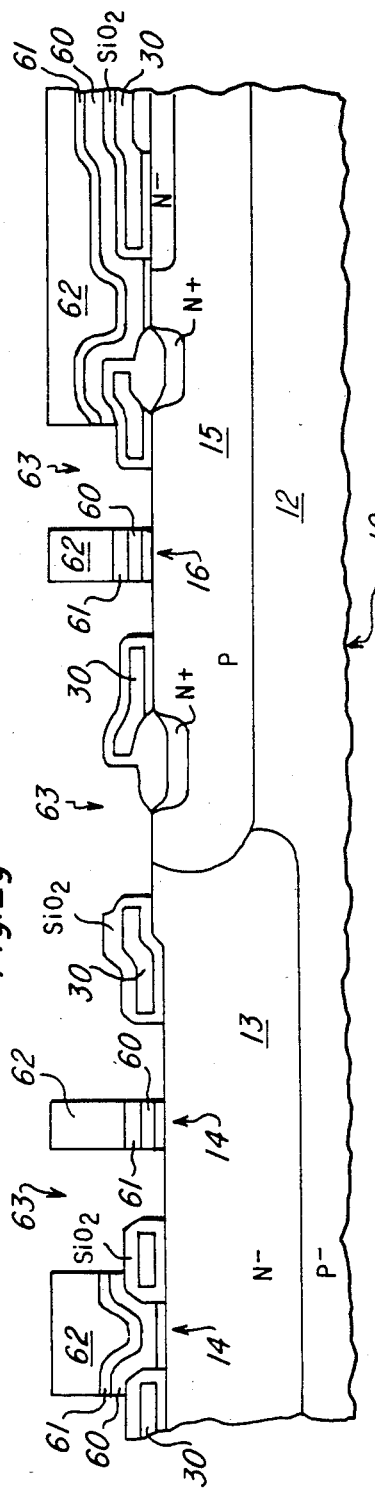

Turning now to FIG. 2h, the gate oxide for the transistors 14,16,19 is grown by exposing to steam at about 850° to produce a thickness of about 200 Å. Then, a layer 60 of molybdenum is deposited to cover the entire slice to a thickness of about 3000 Å by a CVD or sputtering process. This layer will form all of the transistor gates 22 and 27, and various interconnections such as word lines in the memory array. A layer 61 of cap oxide is next deposited over the moly layer to a thickness of about 2000 Å by a plasma-enhanced CVD process. A coating 62 of photoresist is added, and exposed to light through a mask which defines the gates of all of the transistors and the word lines, etc.; this mask is aligned to the edges of the poly storage plates 21 and field plates 30. After developing, holes 63 in the photoresist 62 allow etching of the unwanted moly. The oxide layer 61 is dry etched, then the moly layer 60 is dry etched, leaving the structure of FIG. 2h. The resist 62 is then stripped.

Referring to FIG. 2i, a coating of silicon oxide is deposited over the entire slice to a thickness of about 2500 Å by a plasma-enhanced CVD process, and then the slice is subjected to a plasma etch which removes oxide anisotropically to leave the sidewalls 65 at every sharp edge, particularly at the edges of the moly gates 27 of transistors 14 and 16. This sidewall oxide 65 is used to create a space between the gates of the self-aligned-gate transistors and the drain implant to provide an "LDD" lightly-doped drain transistor structure. The slice is next subjected to a phosphorus implant at a dosage of about 4×10exp14 per sq cm at 100 KeV to produce N+ doped regions 66 in both N-channel and P-channel transistor areas; these will become the source/drain regions 25.

Turning to FIG. 2j, a coating 67 of photoresist is applied and exposed to light through a mask aligned with the poly field plates 30, to create holes 68 over all of the N tanks 13 so that the P-channel source/drains can be counterdoped. To this end, a boron implant is performed at a dosage of about 4×10exp15 per sq cm at an energy of 40 KeV, producing P+ regions 69 which swamp the prior N+ implant in the N−tank areas so the P+ source/drain regions 28 of the P-channel transistors are thus formed. The resist 67 is stripped, and the slice is subjected to an anneal step for perhaps 2½ hours at about 900° C. in argon driving in the regions 66 and 69. All of the source/drain regions are now silicided by depositing 600 Å of titanium by sputtering (tungsten or platinum could also be used), and subjecting to a temperature of about 675° C. for about ½ hour in forming gas. The remaining unreacted titanium is then stripped off, and the titanium silicide is annealed at about 800° C. for about fifteen minutes in forming gas, producing the silicided areas 26.

Referring back to FIG. 1, the next step is deposition of the multilevel oxide coating 39, which is done by a CVD process to provide a thickness of about 5000 Å; usually this layer is lightly phosphorus-doped. Holes are opened in this multilevel oxide coating 39 for the contacts 35 or 38 to the silicided source/drain areas, or to the poly 30 or moly 22, using photoresist exposed through a mask aligned to the poly field plate 30; the oxide 39 is dry etched to provide vertical sidewalls (i.e., no undercut), but tapering at the upper edges due to erosion of the photoresist is desirable. The remaining resist is stripped, and the exposed contact areas 35 and 38 cleaned of oxide by a 1% HF dipout etch. Metal is deposited over the entire slice by sputtering to a total thickness of about 8000 Å; preferably, this metallization consists 2000 to 4000 Å of sputtered tungsten as an underlayer 36 (desirable to promote step coverage and improve electromigration resistance), followed by 4000 to 6000 Å of sputtered silicon-doped aluminum 37. The metal layer 36, 37 is patterned using photoresist and a mask aligned to the contact holes, employing a plasma etch, then the photoresist is stripped. The contacts and metallization are sintered in forming gas at about 450° C. for about an hour.

A protective overcoating (not shown) of silicon nitride is formed by a CVD process to a thickness of about 10,000 Å, and this overcoating is patterned using photoresist and dry etch to expose metal bonding pads in the usual manner. The resist is stripped, and fabrication is completed as is conventional by grinding the back of the slice, depositing gold on the back, probe testing, scribing and breaking into individual chips, and mounting the chips in dual-in-line packages or the like.

While this invention has been described with reference to an illustrative embodiment, this description in not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a CMOS twin-well semiconductor device, comprising the steps of:
    implanting N impurity into a face of a P type silicon body creating at least one N well area and growing oxide over said area,
    implanting P impurity into said face using said oxide as a mask to create at least one P well area, heat treatments driving both said N well and P well into said face,
    forming an oxidation mask on said face over both the N well and P well and opening holes in the oxidation mask over selected areas of the P well, then implanting N+ impurity in said selected areas and growing oxide over the selected areas to create buried N+ regions beneath such oxide, then implanting lighter doped N regions in at least one capacitor area of the P well,
    applying a first conductive coating over said face and patterning it to provide capacitor plates and an isolation field-plate, said first conductive coating being insulated from the face in said at least one capacitor area by a thermal oxide thinner than an oxide coating in field plate areas,
    applying a second conductive coating to said face isolated from said first conductive coating by an insulator, and patterning the second conductive coating to provide transistor gates and interconnects,
    forming sidewall oxide spacers on edges of said gates,
    implanting N impurity into said face in both the N well and P well areas to create N+ source/drain regions, masked by said gates and sidewall oxide spacers,
    masking said at least one P well area and implanting a
    impurity into the N well area to create P+ source/drain regions counterdoping said N impurity,
    applying a third conductive coating over said face isolated from said second and first conductive coatings by an insulator except at contact areas, and patterning the third conductive coating to define interconnects and contacts,
    wherein isolation of at least a pair of N-channel transistors along said face, from one another, is by said field-plate and no thick field oxide is formed for isolating said pair of transistors,
    said field-plate being biased at zero volts.

2. A method according to claim 1 wherein said oxide over said N well is etched after implanting said P well to create a step in said face for use in alignment of masks.

3. A method according to claim 1 wherein N-channel transistors are formed using said buried N+ regions as drains, and also N−channel transistors are formed using said N+ source/drain regions.

4. A method according to claim 1 wherein said first conductive coating is polycrystalline silicon, said second conductive coating is refractory metal, and said third conductive coating is metal.

5. A method according to claim 1 including the step of siliciding the surface of all of said P+ and N+ source/drain regions.

6. A method according to claim 1 wherein said buried N+ regions are drain regions for N−channel transistors in one-transistor memory cells, and are also bit lines in an array of said memory cells.

7. A method according to claim 1 wherein said third conductive coating comprises a lower layer of refractory metal and an upper layer of aluminum.

8. A method according to claim 5 wherein said sidewall spacers are used as a mask in said step of siliciding said source/drain regions.

9. A method according to claim 7 wherein said lower layer comprises tungsten.

10. A method according to claim 9 including the step of forming vertical-walled holes at said contact areas in said insulator isolating said third conductive coating.

* * * * *